United States Patent
Wiley et al.

(10) Patent No.: US 10,139,725 B2
(45) Date of Patent: Nov. 27, 2018

(54) LITHOGRAPHIC APPARATUS

(71) Applicant: ASML Netherlands B.V., Veldhoven (NL)

(72) Inventors: James Norman Wiley, Menlo Park (NL); Juan Diego Arias Espinoza, Eindhoven (NL); Derk Servatius Gertruda Brouns, Herentals (BE); Laurentius Cornelius De Winter, Vessem (NL); Florian Didier Albin Dhalluin, Eindhoven (NL); Pedro Julian Rizo Diago, Veldhoven (NL); Luigi Scaccabarozzi, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 268 days.

(21) Appl. No.: 14/775,249

(22) PCT Filed: Mar. 4, 2014

(86) PCT No.: PCT/EP2014/054190
§ 371 (c)(1),
(2) Date: Sep. 11, 2015

(87) PCT Pub. No.: WO2014/154452
PCT Pub. Date: Oct. 2, 2014

(65) Prior Publication Data
US 2016/0033860 A1   Feb. 4, 2016

Related U.S. Application Data

(60) Provisional application No. 61/805,592, filed on Mar. 27, 2013, provisional application No. 61/884,386, filed on Sep. 30, 2013.

(51) Int. Cl.
  G03B 27/54   (2006.01)
  G03F 1/64   (2012.01)
  (Continued)

(52) U.S. Cl.
  CPC .......... *G03F 1/64* (2013.01); *G03F 1/62* (2013.01); *G03F 7/70908* (2013.01); *G03F 7/70983* (2013.01)

(58) Field of Classification Search
  CPC .... G03F 7/70908; G03F 7/70983; G03F 1/62; G03F 1/64
  (Continued)

(56) References Cited

U.S. PATENT DOCUMENTS 4,131,363 A   12/1978   Shea et al.
4,737,387 A   4/1988   Yen
(Continued)

FOREIGN PATENT DOCUMENTS

DE   10 2008 041 436 A1   4/2009
JP   11-143054 A   5/1999
(Continued)

OTHER PUBLICATIONS

Machine translation of JP 2013-33813, Feb. 2013.*
(Continued)

*Primary Examiner* — Peter B Kim
(74) *Attorney, Agent, or Firm* — Sterne, Kessler, Goldstein & Fox P.L.L.C.

(57) ABSTRACT

The present invention is concerned with an apparatus for shielding a reticle for EUV lithography. The apparatus comprises a pellicle, and at least one actuator in communication with the pellicle, the actuator being configured to induce, in use, movement of the pellicle with respect to a reticle.

24 Claims, 8 Drawing Sheets

(51) Int. Cl.
*G03F 1/62* (2012.01)
*G03F 7/20* (2006.01)

(58) Field of Classification Search
USPC .................................................. 355/71, 67
See application file for complete search history.

(56) References Cited

U.S. PATENT DOCUMENTS

| | | | |
|---|---|---|---|
| 6,197,454 | B1 | 3/2001 | Yan |
| 6,264,773 | B1 | 7/2001 | Cerio |
| 6,317,479 | B1 * | 11/2001 | Chiba ................... B82Y 10/00 378/34 |
| 9,075,321 | B2 | 7/2015 | Mueller et al. |
| 2005/0040345 | A1 | 2/2005 | Bakker et al. |
| 2005/0045262 | A1 | 3/2005 | Eschbach et al. |
| 2007/0052945 | A1 * | 3/2007 | Loos ........................ G03F 1/64 355/75 |
| 2008/0254211 | A1 | 10/2008 | Kurt et al. |
| 2010/0195076 | A1 | 8/2010 | Mueller et al. |
| 2011/0189594 | A1 | 8/2011 | Sekihara |

FOREIGN PATENT DOCUMENTS

| | | |
|---|---|---|
| JP | 2004-296829 A | 10/2004 |
| JP | 2005-062634 A | 3/2005 |
| JP | 2013-033813 A | 2/2013 |
| KR | 10-2004-0001790 A | 1/2004 |
| TW | 2011055555 A1 | 2/2011 |

OTHER PUBLICATIONS

International Search Report directed to related International Patent Application No. PCT/EP2014/054190, dated May 14, 2014; 6 pages.

International Preliminary Report on Patentability and Written Opinion of the International Searching Authority directed to related International Patent Application No. PCT/EP2014/054190, dated Sep. 29, 2015; 12 pages.

\* cited by examiner

LITHOGRAPHIC APPARATUS

CROSS-REFERENCE TO RELATED APPLICATIONS

This application claims the benefit of U.S. provisional application 61/805,592, which was filed on 27 Mar. 2013, and of U.S. provisional application 61/884,386, which was filed on 30 Sep. 2013, and which is incorporated herein in its entirety by reference.

FIELD

The present invention relates to a lithographic apparatus and to components that may form part of a lithographic apparatus (or some other apparatus).

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A lithographic apparatus typically includes an illumination system configured to condition a radiation beam; a support structure constructed to hold a patterning device, such as a reticle or mask, the patterning device being capable of imparting the radiation beam with a pattern in its cross-section to form a patterned radiation beam; a substrate table constructed to hold a substrate; and a projection system configured to project the patterned radiation beam onto a target portion of the substrate.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

In an alternative arrangement a radiation system for producing EUV radiation may use an electrical discharge to generate the plasma. The electrical discharge passes into a gas or vapor such as Xe gas, Li vapor or Sn vapor, generating a very hot plasma that emits EUV radiation. Such a radiation system is typically termed a discharge produced plasma (DPP) source.

Plasma creation within an EUV source may cause contamination particles to be created from the fuel. Contamination within an EUV lithographic apparatus may adhere for instance to optical surfaces such as mirrors of the apparatus, or to the patterning device of the lithographic apparatus. The contamination may reduce the efficiency with which EUV radiation is reflected by the mirrors and/or may reduce the accuracy with which a pattern is projected by the EUV lithographic apparatus onto a substrate. The contamination of the optical surfaces or of the patterning device may require them to be replaced, which can be expensive and therefore any reduction in the replacement frequency may be advantageous. Furthermore, replacement of such parts of the lithographic apparatus or the EUV source is a time consuming process, during which the operation of the lithographic apparatus may have to be stopped. Stopping the operation of the lithographic apparatus may reduce the output of the lithographic apparatus and thereby reduce its efficiency, which is undesirable.

It is desirable to obviate or mitigate at least one problem of the prior art, whether identified herein or elsewhere, or to provide an alternative to existing apparatus or methods. In particular it is one object of the invention, amongst others, to provide methods and apparatus for generation of radiation, such as EUV radiation.

SUMMARY

Pellicles or films are used in EUV lithography to shield or protect the patterned surfaces of reticles that are used to impart patterns to an EUV beam incident on the reticle's patterned surface for use in device patterning. In general, a pellicle is a membrane configured to permit the passage of a radiation beam through the membrane, and to prevent the passage of contamination particles through the membrane. It is desirable that such pellicles are highly transmissive to radiation of desired wavelengths whilst also acting as a barrier to particulate deposits transferring onto the patterned surface of the reticles. Such deposits could lead to defects in devices patterned using the reticles, and so it is desirable to maintain low levels of such defects to sustain high production yields. In practice, no particles in excess of a certain particle size (say about 20 nm) may be tolerated on a reticle surface. The use of a pellicle at a height of approximately 2 mm from a surface of the reticle may increase the tolerated particle size to, for example, about 2 μm, and this also facilitates inspection and monitoring of particle contamination, on the pellicle surface. Larger particles are more easily monitored. Pellicles may also be used to provide a spectral purity filter, filtering undesired wavelengths (for example deep ultraviolet (DUV)) from the radiation incident on the reticle.

Contaminant particles may arise, in an EUV lithography apparatus, from various sources. Fast-moving particles can be produced from the EUV radiation source, particularly when the source includes a plasma for generation of EUV radiation, and these may pass through the intermediate focus aperture of the source-collector assembly into the illuminator assembly and eventually may reach reticles after elastic collisions with mirrors, following the path of the EUV beam.

Slow-moving particles may be lifted by system vibration and moving parts inside an EUV apparatus and may randomly deposit on patterned surfaces of reticles.

Prior art pellicles are typically made of a silicon membrane or film, as silicon has a high transmissivity for EUV radiation. However, the low thickness required for the silicon pellicle may require a mesh (e.g., grid or honeycomb) support structure to hold the pellicle in place over a patterned surface of a reticle. In order to reduce the impact of the mesh pattern interfering with the EUV patterning by the reticle, it has been suggested that the pellicle and mesh be supported several mm, such as 5 mm, spaced from the patterned surface of the reticle. In lithographic apparatus, clearance space is at a premium and so it is desirable to have pellicles positioned close to the patterned reticle surface, say as close as about 2.5 mm or less from the patterned surface. However, even with spacings of about 5 mm or more for the pellicle, from the reticle, the mesh pattern still may have a negative impact on high resolution patterning. Other reasons for use of a mesh in combination with a pellicle may be for the provision of a spectral purity filter, to filter, for example, infrared radiation.

It is an object of the invention to provide pellicle arrangements, suitable for shielding reticles from particulate deposition, which address or overcome the problems in the prior art, as set out above or elsewhere.

According to a first aspect of the present invention, there is provided an apparatus for shielding a reticle for lithography, the apparatus comprising: a pellicle; and at least one actuator, the apparatus being arranged such that, in use, the actuator causes movement of the pellicle with respect to a reticle.

The apparatus of the first aspect allows negative effects associated with shadowing of the reticle by the pellicle, by debris resting on a surface of the pellicle or by wrinkles/non-uniformities in the pellicle, to be alleviated by movement of the pellicle with respect to the reticle during exposure of the reticle to radiation such as EUV radiation. In turn, this allows for the reticle to be placed in closer proximity to the patterned surface of a reticle, thereby advantageously reducing space requirements within a lithography apparatus in which the apparatus may be used. As such, the apparatus of the first aspect can be used in lithography apparatus where space constraints are such that use of prior art pellicles is problematic.

The movement may be substantially in a plane parallel to a plane defined by a patterned surface of a reticle. In this way, the space required for the apparatus within a lithography apparatus is advantageously reduced.

The at least one actuator may be a piezoelectric transducer.

The apparatus may be arranged such that the at least one actuator induces periodic movement of the pellicle with respect to the reticle. For example, the movement may be oscillatory movement of the pellicle with respect to a reticle. The movement may also be monotonic.

The induced movement of the pellicle may be such that at least one period is completed in a time period required for a local exposure to radiation. In other embodiments, however, the induced movement may be such that less than one period is completed during a local exposure.

The apparatus may be arranged such that the at least one actuator induces movement of the pellicle such that at least one period is completed in a time period required for a global exposure to radiation.

The apparatus may further comprise a frame for supporting the pellicle above a reticle of a lithography apparatus. The frame may comprise the at least one actuator. The at least one actuator may be integral with the frame, such that the entire apparatus, including the actuators, can be removed and serviced from a lithography apparatus.

The frame may comprise a first frame member for mounting on a surface of a reticle and a second frame member for supporting said pellicle. The first and second frame members may be connected by at least one of a flexible member, a resilient member, or a shock absorbing member.

According to a second aspect of the present invention, there is provided a method for shielding a reticle of a lithography apparatus, comprising: inducing movement relative to said reticle of a pellicle supported above the reticle during exposure of the reticle to EUV radiation.

The movement may be within a plane parallel to a plane defined by a patterned surface of the reticle.

The movement may be induced with a piezoelectric transducer.

The movement may be passive movement. For example, the movement may be passively induced by movement of the reticle. The reticle may be moved, for example, during a scanning operation.

The movement may be periodic. For example, the movement may be oscillatory.

At least one period may be completed in a time period required for a local exposure.

At least one period may be completed in a time period required for a global exposure.

The movement may be adapted such that radiation received at the reticle has a substantially uniform intensity distribution over a patterned surface of the reticle.

The movement may be adapted to substantially reduce an effect of shadowing caused by a mesh supporting the pellicle on an intensity distribution of radiation received at a patterned surface of the reticle.

The movement may be adapted to average an effect of shadowing caused by the mesh over the patterned surface of the reticle.

According to a third aspect of the present invention, there is provided a reticle assembly for EUV lithography, the reticle assembly comprising: a reticle having a patterned surface adapted to impart a pattern to a radiation beam incident thereon; a pellicle held over the patterned surface; and at least one actuator, the reticle assembly being configured such that the actuator induces movement of the pellicle with respect to the patterned surface.

According to a fourth aspect of the present invention, there is provided a lithographic apparatus arranged to project a pattern from a reticle assembly onto a substrate with a radiation beam having a wavelength from about 5 nm to about 20 nm, wherein the reticle assembly is a reticle assembly according to the third aspect.

The lithographic apparatus may further comprise: an illumination system configured to condition the radiation beam; a support structure constructed to hold the reticle assembly, the reticle assembly being capable of imparting the radiation beam with a pattern in its cross-section to form a patterned radiation beam; a substrate table constructed to hold a substrate; and a projection system configured to project the patterned radiation beam onto a target portion of the substrate.

The actuators may be integral with the support structure constructed to hold the reticle assembly. Alternatively, the actuators may be integral with a frame configured to support the pellicle, where the frame configured to support the pellicle is not integral with the support structure configured to support the reticle assembly.

According to a fifth aspect of the present invention, there is provided a device manufacturing method comprising generating radiation using the lithographic apparatus of the fourth aspect to pattern a substrate.

According to a sixth aspect of the present invention, there is provided a pellicle assembly, comprising: a pellicle frame; wherein the pellicle frame comprises an inner frame for supporting the pellicle above a reticle and an outer frame removably coupled to the inner frame.

The inner frame is flexible. The outer frame may be rigid.

The inner frame may form a rectangle, and each edge of the rectangle may have a cross sectional area of 4 mm2 or less in a plane perpendicular to a longitudinal axis of the edge.

The inner frame may be constructed from stainless steel.

The outer frame may be coupled to the inner frame by a plurality of fasteners. At least three fasteners may be provided along each edge of the pellicle frame.

According to a seventh aspect of the present invention, there is provided a method of mounting a pellicle on a surface of a reticle, comprising: placing atop the reticle a pellicle assembly according to the sixth aspect; and removing the outer frame from the pellicle assembly.

According to an eighth aspect of the present invention, there is provided a pellicle assembly, comprising a frame for supporting a pellicle above a reticle; and wherein the pellicle frame is arranged such that, in use, movement is induced in the pellicle with respect to a reticle.

The movement may be substantially in a plane parallel to a plane defined by a patterned surface of a reticle.

The movement induced may be periodic movement of the pellicle with respect to the reticle.

The pellicle assembly may be arranged such that oscillatory movement of the pellicle with respect to a reticle is induced in use.

The pellicle assembly may be arranged such that the movement of the pellicle induced is such that at least one period is completed in a time period required for a local exposure of a reticle to radiation.

The pellicle assembly may be arranged such that movement of the pellicle is induced such that at least one period is completed in a time period required for a global exposure of a reticle to radiation.

The pellicle assembly may further comprise a frame for supporting the pellicle above a reticle; and an actuator may be provided to induce movement of a reticle, said movement of the reticle causing said movement of the pellicle.

The pellicle assembly may further comprise a frame for supporting the pellicle above a reticle, wherein the frame comprises at least one actuator, said actuator being arranged to induce said movement of the pellicle.

The frame may comprise a first frame member for mounting on a surface of a reticle, a second frame member for supporting said pellicle; and the first and second frame members may be connected by at least one of a flexible member, a resilient member, or a shock absorbing member.

In any of the first, third, fourth, sixth or eighth, two actuators may be provided, each actuator being arranged to induce oscillations in a pellicle in a direction perpendicular to the other actuator.

The oscillations induced by each of the two actuators may differ with respect to at least one of frequency, phase or amplitude.

The two oscillators may be arranged to oscillate the pellicle such that the pellicle is not stationary at any time during the movement of the pellicle.

The two oscillators may be arranged to oscillate the pellicle in a Lissajous pattern.

In the second aspect above, inducing movement may comprise inducing oscillatory movement in the pellicle in two perpendicular directions.

Oscillations induced in one direction may differ from oscillations induced in the other direction with respect to at least one of frequency, phase or amplitude.

The oscillatory movement may be such that the pellicle is not stationary at any time during the movement of the pellicle.

The induced movement may follow a Lissajous pattern.

Where a mesh is provided in any of the aspects above, the mesh may comprise a non-periodic grid structure and may, for example, comprise a Penrose grid structure.

According to a ninth aspect of the present invention, there is provided a method for manufacturing a membrane assembly for use as a pellicle assembly or as a dynamic gas lock membrane, comprising: causing within a membrane a tensile stress of a first amount in a first dimension and a tensile stress of a second amount larger than the first amount in a second dimension. The membrane remains under different tensile stresses in the first and second dimensions while mounted to a frame. The stresses may be applied in each or either of the first and second dimensions while the membrane is mounted to a frame, or may be applied before mounting the membrane to the frame.

The second dimension may be substantially parallel to a longitudinal axis of the membrane and the first dimension may be substantially parallel to a latitudinal axis of the membrane.

The second dimension may be substantially perpendicular to a scanning direction of a radiation beam incident on the membrane during use. The first dimension may be substantially perpendicular to the first dimension.

A difference between the first and second amounts of stress within the membrane may be selected in dependence upon an aspect ratio of a scanning radiation beam incident on the membrane during use.

A difference between the first and second amounts of stress within the membrane may be selected in dependence upon a difference in thermal expansion induced in the membrane in the first dimension and the second dimension during use.

Where the membrane is for use as a pellicle, a ratio between the first amount of stress and the second amount of stress may be of the order of 1:13.

Where the membrane is for use as a dynamic air lock membrane a ratio between the first amount of stress and the second amount of stress may be of the order of 1:3.

According to a tenth aspect, there is provided an apparatus for use as a pellicle assembly or a dynamic gas lock membrane assembly, comprising: a membrane mounted to a frame; wherein the mounted membrane is under tensile stress of a first amount in a first dimension and under tensile stress of a second amount greater than the first amount in a second dimension.

The second dimension may be substantially parallel to a longitudinal axis of the membrane and the first dimension may be substantially parallel to a latitudinal axis of the membrane.

The second dimension may be substantially perpendicular to a scanning direction of a radiation beam incident on the membrane during use and the first dimension may be substantially perpendicular to the first dimension.

A difference between the first and second amounts of stress may be substantially proportional to an aspect ratio of a scanning radiation beam incident on the membrane during use.

A difference between the first and second amounts of stress may be substantially proportional to a difference in thermal expansion induced in the membrane in the first dimension and the second dimension during use.

The membrane may be a pellicle, and a ratio between the first amount of stress and the second amount of stress may be of the order of 1:13.

The membrane may be a dynamic air lock membrane and a ratio between the first amount of stress and the second amount of stress may be of the order of 1:3.

According to an eleventh aspect of the present invention, there is provided an apparatus according to any one of the first, third, fourth, sixth, or eighth aspects wherein the pellicle is a pellicle according to the tenth aspect.

According to a twelfth aspect, there is provided a method according to any of the second, fifth or seventh aspects, wherein the pellicle is a pellicle according to the tenth aspect.

One or more aspects of the invention may, where appropriate to one skilled in the art, be combined with any one or more other aspects described herein, and/or with any one or more features described herein.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
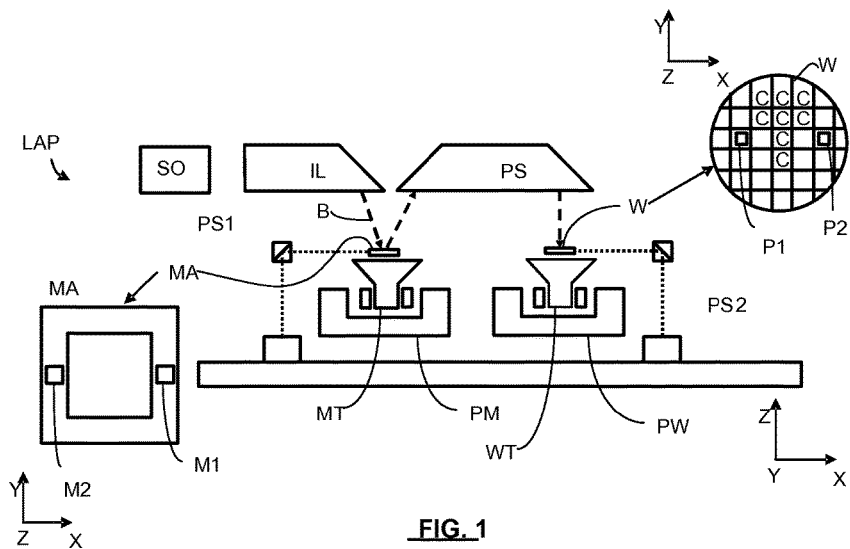
FIG. 1 is a schematic depiction of a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus LAP including radiation source SO according to an embodiment of the invention. The apparatus comprises: an illumination system (illuminator) IL arranged to condition a radiation beam B (e.g., EUV radiation); a support structure (e.g., a mask table) MT constructed to support a patterning device (e.g., a mask or a reticle) MA and connected to a first positioner PM arranged to accurately position the patterning device; a substrate table (e.g., a wafer table) WT constructed to hold a substrate (e.g., a resist-coated wafer) W and connected to a second positioner PW arranged to accurately position the substrate; and a projection system (e.g., a reflective projection system) PS arranged to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum or at least a low gas pressure environment for EUV radiation since gases may absorb too much radiation. A vacuum or low gas pressure environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation (EUV) beam from the radiation source SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream, cluster or jet of material having the required line-emitting element, with a laser beam.

The radiation source SO may be part of an EUV radiation system including a fuel stream generator for generating a stream of fuel and/or a laser (neither of which are shown in FIG. 1), for providing the laser beam for exciting the fuel. The resulting plasma emits output radiation, e.g., EUV radiation, which is collected using a radiation collector, disposed in the radiation source. The laser and/or fuel stream generator and the collector module (often referred to as radiation source), may be separate entities, for example when a $CO_2$ laser is used to provide the laser beam for fuel excitation.

In such cases, the laser is not considered to form part of the lithographic apparatus and the radiation beam is passed from the laser to the radiation source with the aid of a beam delivery system comprising, for example, suitable directing mirrors and/or a beam expander. In other cases the excitation beam source may be an integral part of the radiation source, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
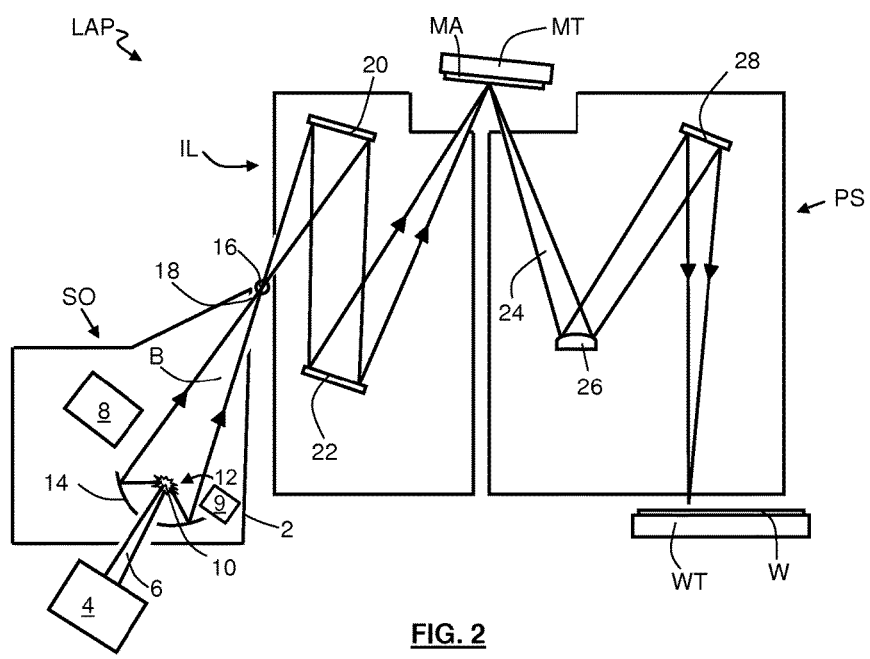
FIG. 2 is a schematic depiction of a more detailed view of the lithographic apparatus of FIG. 1.

FIG. 2 shows the lithographic apparatus 100 in more detail, including the source collector apparatus SO, the illumination system IL, and the projection system PS. The source collector apparatus SO is constructed and arranged such that a vacuum or low gas pressure environment can be maintained in an enclosing structure 220 of the source collector apparatus SO.

A laser 4 is arranged to deposit laser energy via a laser beam 6 into a fuel, such as tin (Sn) or lithium (Li), which is provided from a fuel stream generator 8. Liquid (i.e., molten) tin, or another metal in liquid form, is preferred. A fuel trap 9 is arranged to receive fuel not spent during plasma creation. The deposition of laser energy into the fuel creates a highly ionized plasma 10 at a plasma formation location 12, which has electron temperatures of several tens of electron volts (eV). The energetic radiation generated during de-excitation and recombination of these ions is emitted from the plasma 10, collected and focused by a near normal incidence radiation collector 14 (sometimes referred to more generally as a normal incidence radiation collector). The collector 14 may have a multilayer structure, for example one tuned to reflect, more readily reflect, or preferentially reflect, radiation of a specific wavelength (e.g., radiation of a specific EUV wavelength). The collector 14 may have an elliptical configuration, having two natural ellipse focus points. One focus point will be at the plasma formation location 10, and the other focus point will be at the intermediate focus, discussed below. In some embodiments of the invention, the radiation collector may comprise a grazing incidence collector.

A laser 4 and/or radiation source and/or a collector 14 may together be considered to comprise a radiation source, specifically an EUV radiation source. The EUV radiation source may be referred to as a laser produced plasma (LPP) radiation source. The collector 14 in the enclosing structure 2 may form a collector module, which forms a part of the radiation source (in this example).

A second laser (not shown) may be provided, the second laser being configured to preheat the fuel before the laser beam 6 is incident upon it. An LPP source that uses this approach may be referred to as a dual laser pulsing (DLP) source. Such a second laser may be described as providing a pre-pulse into a fuel target, for example to change a property of that target in order to provide a modified target. The change in property may be, for example, a change in temperature, size, shape or the like, and will generally be caused by heating of the target.

Although not shown, the fuel stream generator 8 will generally comprise, or be in connection with, a nozzle configured to direct fuel, along a trajectory towards the plasma formation location 12.

Radiation B that is reflected by the radiation collector 14 is focused at a source image 16. The source image 16 is commonly referred to as the intermediate focus, and the radiation source SO is arranged such that the intermediate focus 16 is located at or near to an opening 18 in the enclosing structure 2. The source image 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures. For example there may be 1-6 (or more) additional reflective elements present in the projection system PS than shown in FIG. 2.

While an LPP source is shown in FIG. 2, in other embodiments of the invention, the source collector apparatus SO may comprise a DPP source.

The use of a pellicle is known as a way of preventing debris (e.g., contaminant or dust particles) from coming into contact with the patterning device. Any debris that comes to rest on the patterning device, such as a reticle, may cause substantial degradation in the imaging performance of the lithographic apparatus because the patterning device (and hence the debris in contact with the patterning device) is in the focal plane of the lithographic apparatus. The pellicle covers the patterning device and prevents debris from reaching the patterning device. Any debris that comes to rest on the pellicle will not be in the focal plane of the lithographic apparatus and therefore any degradation in the imaging performance of the lithographic apparatus cause by the debris will be less than if the debris had come to rest on the patterning device.

Figure 3:
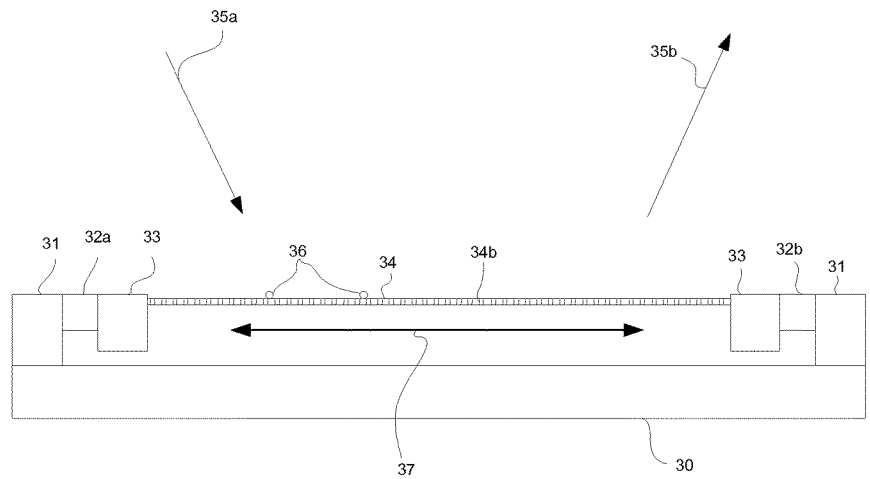
FIG. 3 is a schematic depiction of a pellicle arrangement according to an embodiment of the present invention.

FIG. 3 schematically illustrates a cross-sectional view through an embodiment of a patterning device assembly according to an embodiment of the invention, the patterning device assembly being suitable for use, for example, in the lithographic apparatus depicted in FIG. 1 and/or FIG. 2. A patterning device in the form of a reticle 30 is shown having an outer frame 31 mounted on a patterned surface thereof. Actuators 32a, 32b are mounted to the outer frame 31. An inner frame 33 is mounted to the actuators 32a, 32b, and a pellicle 34 is supported above the patterned reticle 30 by the inner frame 33 (in combination with the outer frame 31 and the actuators 32a, 32b). The inner frame 33 is arranged to support the pellicle 34 at a fixed distance from the reticle 30, such that any particles incident on the surface of the pellicle 34 are outside of the focal plane of focusing optics of the illuminator IL. The pellicle 34 is supported by a mesh 34b, which is integral with the pellicle 34.

In some embodiments, one or more continuous support layers may be provided in addition or in place of a mesh support 34b. For example, in some embodiments, continuous supports and/or mesh supports may be provided in a sandwich configuration. The mesh and/or continuous supports may be adapted to provide protection to the pellicle 34 and or reticle 30 from environmental factors other than/in addition to particulate contamination, such as protection from temperature and/or mechanical stresses.

Figure 4:
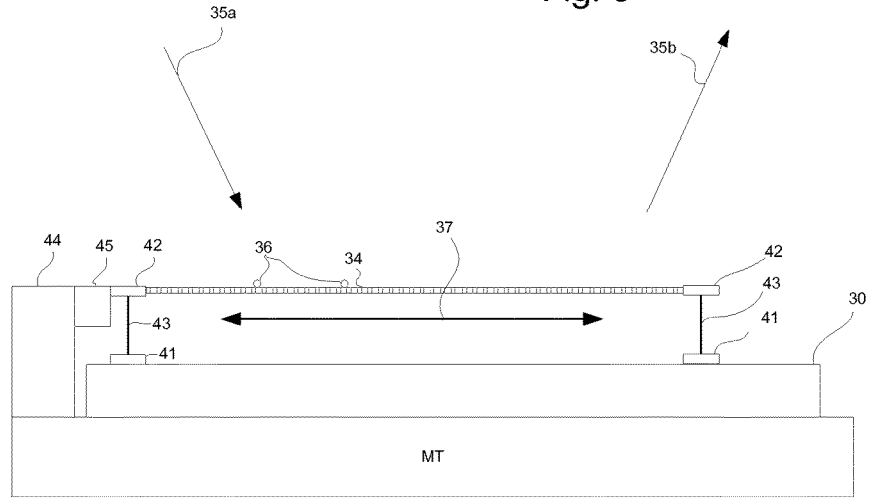
FIG. 4 is a schematic depiction of a pellicle arrangement according to an alternative embodiment of the present invention.

As described above, in use the reticle 30 is exposed to radiation, which is, in the presently described embodiment, EUV radiation. As schematically illustrated in FIG. 4, an EUV radiation beam 35a passes through pellicle 34 to impinge upon a patterned surface of the reticle 30, acquiring a pattern therefrom, and reflecting from the reticle 30 as a patterned EUV beam 35b, which passes back through the pellicle 34. Debris particles 36 are prevented from contacting the patterned surface of reticle substrate 30 by being collected on the outer surface of the pellicle 34. The patterned EUV beam 35b is passed to a projection system that focuses the beam onto a target portion of a substrate, to impart the pattern onto the target portion.

In some embodiments of the invention, the pellicle 34 may comprise a single layer, while in other embodiments the pellicle 34 may comprise a plurality of layers. The pellicle 34 may have a total thickness in a range of approximately 1 nm to approximately 100 nm. A total thickness of the pellicle 34 with the supporting mesh 34b, may be in a range of approximately 100 nm to 50 µm.

During exposure, the mesh 34b that supports the pellicle 34 causes variations in the intensity of radiation that is received on the patterned surface of the reticle 30. That is, at different times during exposure of the reticle 30, some regions of the EUV beam 35a will be incident upon and absorbed by the mesh 34b supporting the pellicle 34 causing shadows on the patterned surface of the reticle 30. Such mesh-induced intensity variations cause corresponding variations in the reflected, patterned, EUV radiation beam 35b.

To counteract the shadowing effect of the mesh 34b, the actuators 32a, 32b are configured to cause a movement (such as oscillations) in the position of the pellicle 34 and mesh 34b. In some embodiments, the actuators 32a, 32b are configured to induce small lateral motions in the position of the pellicle 34 (and mesh 34b) with respect to the reticle 30. The motion of the pellicle 34 induced by the actuators 32a, 32b is illustrated by an arrow 37. By lateral, it is to be understood that movement of the pellicle 34 is substantially in a plane parallel to the plane defined by the patterned surface of the reticle 30.

In some embodiments, the movement of the pellicle is substantially in one dimension (i.e., side-to-side or forwards-and-backwards), while in other embodiments the movement is substantially within two dimensions (i.e., side-to-side and/or backwards-and-forwards). For example, the pellicle 34 may be moved in a circular fashion. In some embodiments of the invention, the movement may be in additional dimensions (i.e., outside the plane parallel to the plane defined by the patterned surface of the reticle). That is, in some embodiments, movement is not only lateral, but may also be vertical (i.e., in a direction perpendicular to a plane defined by the patterned surface of the reticle 30). In some embodiments, the movement of the pellicle 34 may be in a direction transverse to a scanning direction of movement of the reticle, while in other embodiments the movement of the pellicle 34 may be in a direction parallel to a scanning direction of movement of the reticle.

Directions of movement of the pellicle 34 may be selected in dependence upon a configuration of the mesh 34b. Similarly, configurations of the mesh 34b may be selected in accordance with a predetermined movement of the pellicle 34. In particular, movement of the pellicle 34, or configuration of the mesh 34b, may be selected such that the movement of the pellicle 34 does not track any continuous features of the mesh 34b.

Figure 6A:
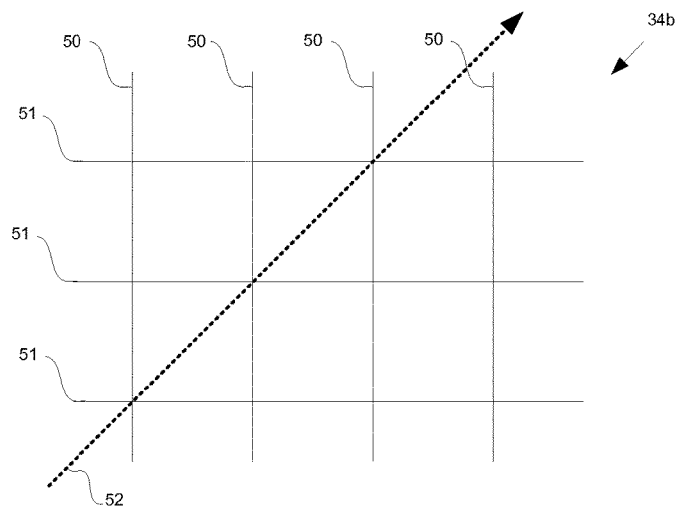
FIGS. 6a and 6b schematically depict movement of a pellicle with reference to respective supporting mesh configurations.
Figure 6B:
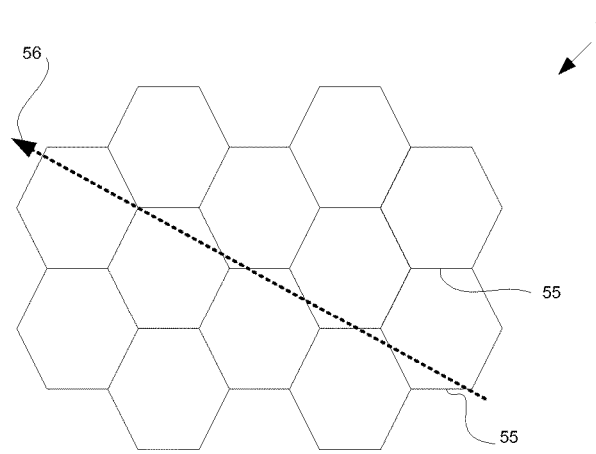

For example, FIG. 6a schematically depicts part of the mesh 34b in an embodiment in which the mesh 34b comprises a square grid arrangement having "vertical" components 50 and horizontal components 51. An arrow 52 illustrates the direction of movement of the pellicle 34. It can be seen the movement of the pellicle 34 is an angle of 45 degrees to the vertical and horizontal components 50, 51, such that neither the vertical or horizontal components 50, 51 are tracked by the movement of the pellicle 34. FIG. 6b illustrates an alternative example in which the mesh 34 comprises a hexagonal honeycomb structure. Components 55 of the hexagonal structure define a horizontal direction and an arrow 56 at a 30 degree angle to the horizontal components depicts a direction of movement of the pellicle 34. It is to be understood that the directions of movement of the pellicle 34 in relation to components of the mesh 34b illustrated in FIGS. 6a, 6b are merely exemplary.

By varying the position of the pellicle 34 during exposure of the reticle 30, mesh-induced intensity variations can be reduced through the averaging of the mesh-induced intensity variations over the patterned surface of the reticle 30. That is, a portion of the reticle 30 that is shadowed to EUV radiation by the mesh at one moment during exposure of the pellicle 34 will not be shadowed by the mesh at another moment during exposure of the pellicle 34. As such, over the time of exposure, each portion of the reticle 30 obtains substantially the same amount of EUV radiation.

In some embodiments, the radiation 35a is incident only on a portion of the patterned surface of the reticle 30 at any one time. In such embodiments, the radiation 35a is scanned across the patterned surface of the reticle 30 (for example by movement of the mask table MT) over a time required to pattern a die of a substrate (which may depend upon a power of the radiation beam 35a). As an illustrative example, if a patterned surface of the reticle 30 is 13 cm wide, the radiation beam 35a has a width of 1 cm and is scanned across the patterned surface of the reticle 30 at a speed of 0.65 m/s, then the radiation beam 35a would be incident on each respective 1 cm strip of the patterned surface of the reticle 30 for a time of approximately 15 ms. The period of time at which the radiation 35a is incident on a single portion of the reticle 30 may be referred to as a local exposure time.

Movement of the pellicle 34 may be repetitive during each single local exposure time in order to allow a desired averaging of mesh-induced intensity variations to occur during each single local exposure time. For example, in the example described above, the pellicle 34 may be caused to oscillate with a frequency of at least once in 15 ms (i.e., approximately 67 Hz). More generally, in some embodiments of the invention oscillation of the pellicle 34 may have a frequency in a range of approximately 100 Hz to 1 KHz, although it is to be appreciated that any appropriate frequency may be used.

In some embodiments of the invention, the radiation 35a is incident on the entire area of the patterned surface of the reticle 30 and is therefore not scanned. In such embodiments, the time during which the patterned surface of the reticle 30 is exposed to the radiation 35a may be referred to as a full-field exposure time. Movement of the pellicle 34 may be repetitive during each full-field exposure time.

The outer frame 31, transducers 32a, 32b and the inner frame 33 may, together, provide an integrated pellicle frame. However, while the actuators 32a, 32b are illustrated in FIG. 3 as being mounted directly to a frame atop the reticle 30, it is to be appreciated that the actuators may be mounted in any appropriate way.

FIG. 4 schematically illustrates an alternative example embodiment of the invention in which the actuators 32a, 32b are mounted to another part of the lithographic apparatus, in particular the support structure MT. In the embodiment of FIG. 4, as in the embodiment of FIG. 3, the pellicle 34 is supported by a frame mounted on the reticle 30. In particular, a lower frame 41 is mounted atop the patterned surface of the reticle 30, and is connected to an upper frame 42 via a flexible member 43. The pellicle 34 is connected to the upper frame 42. The support structure MT comprises a frame 44 extending from a base of the support structure MT atop which the pellicle 34 sits. An actuator 45 is mounted to the frame 44 in communication with the top frame 42. As in the embodiment illustrated in FIG. 3, the actuator 45 is configured to cause oscillations in the position of pellicle 34 through movement of the top frame 42.

In some embodiments, the actuators 32a, 32b may be, for example, piezoelectric motion transducers. In this way, the movement of the pellicle 34 can be precisely controlled.

Figure 5:
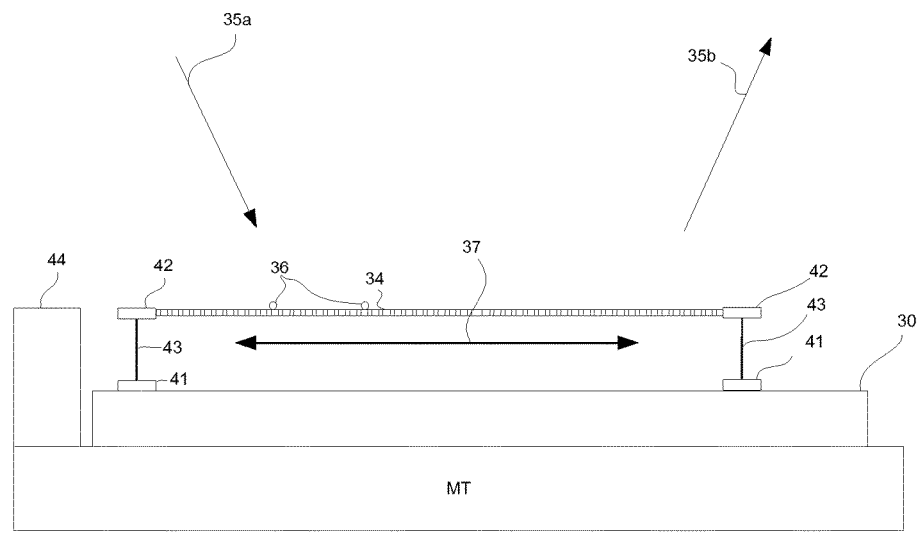
FIG. 5 is a schematic depiction of a pellicle arrangement according to a further alternative embodiment of the present invention.

FIG. 5 illustrates an alternative embodiment of the invention in which actuation of the pellicle 34 may be passive. FIG. 5 shows generally the same arrangement as shown in FIG. 4 with equivalent components having the same reference numerals. In the embodiment of FIG. 5, however, the upper frame 42 is not connected to an actuator. In the embodiment of FIG. 5, movement is imparted to the pellicle 34 through movement of the reticle 30, during a scanning operation. In particular, the flexible members 43 have a natural frequency such that movement of the reticle 30 causes desired oscillations of the pellicle 34. For example, where the reticle 30 is moved in discrete steps, the natural frequency of the flexible members 43 may be such that each step results in oscillations of a desired frequency and magnitude. The embodiment illustrated in FIG. 5 is particularly advantageous for not requiring additional actuators and accompanying power supplies.

Figure 7:
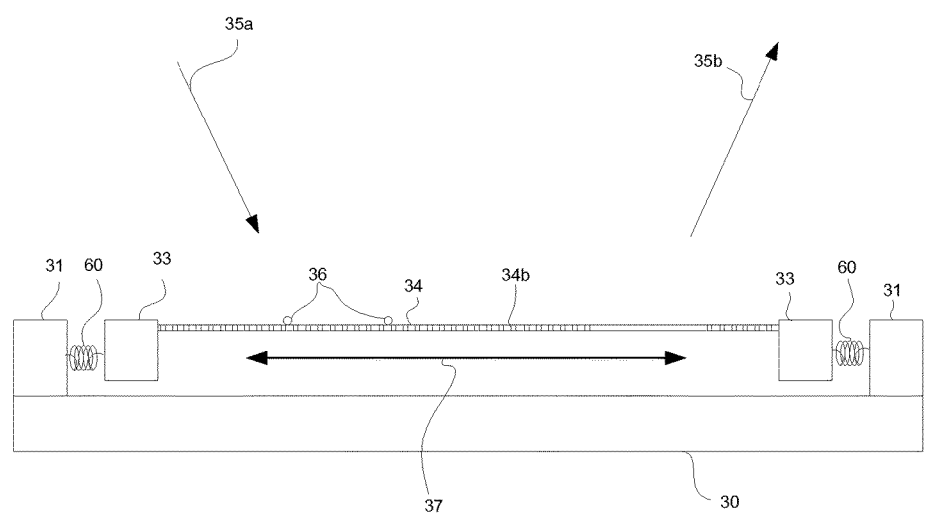
FIG. 7 is a schematic depiction of a pellicle arrangement according to a further alternative embodiment of the present invention.

FIG. 7 illustrates a further alternative embodiment of the invention in which actuation of the pellicle 34 is passive. FIG. 7 shows generally the same arrangement as shown in FIG. 3 with equivalent components having the same reference numerals. In the embodiment of FIG. 7, resilient members 60 are mounted to the outer frame 31. Two resilient members are illustrated in FIG. 7, though it will be appreciated that any number of resilient members may be provided. The inner frame 33 is connected to the resilient members 60. In FIG. 7 the resilient members 60 are depicted as helical springs, though it will be appreciated that other forms of resilient member may be used. The helical springs 60 define a longitudinal axis substantially parallel to the plane of movement of the pellicle 34.

In other example embodiments, other resilient members such as a leaf spring may be used in place of a helical spring. For example, a leaf spring may be mounted to the outer frame 31 at a right angle to the plane of lateral motion of the pellicle 34, and the inner frame mounted to the leaf spring.

In some embodiments, passive motion may be induced in the pellicle 34 by forces applied to the pellicle 34 prior to, or between, each exposure of the reticle 30 to radiation. In some embodiments, the pellicle 34 is caused to move laterally in a plane parallel to the plane defined by the patterned surface of the reticle 30 due to inertial forces imparted during movement of the mask table MT in between each exposure scan. In some embodiments, the movement of the mask table MT may be arranged and/or actively controlled so as to induce a desired movement of the pellicle 34. That is, movement of the mask table MT may deviate from a normal, or regular, movement exhibited by the mask table MT so as to achieve a desired movement of the pellicle 34. It will be appreciated, however, that any appropriate means may be employed to induce passive motion of the pellicle 34 with respect to the patterned surface of the reticle 30.

The movement of the pellicle 34 may be monotonic or oscillatory. As such, in addition to, or in place of, resilient members 60, shock absorbing members may be provided between the outer frame 31 and the inner frame 33. For example, in some embodiments a shock absorbing material may be provided between the outer frame 31 and the inner frame 33, the properties of which shock absorbing device (such as a dashpot) or material being selected in dependence upon a movement that it is desired to induce in the pellicle 34. Such a shock absorber may be arranged so as to compress from an initial state in response to a large force, and to slowly return to the initial state. A compressive force may be supplied by any means; for example external means such as an actuator, or by movement of the mask table MT.

In some embodiments of the invention, the pellicle may be rotated, or otherwise moved, relative to the reticle during exposure. Where the pellicle is rotated, any mesh supporting the pellicle is preferably arranged such that rotation of the pellicle results in a substantially even quantity of EUV radiation being incident on the patterned surface of the reticle during exposure.

While the embodiments described above are directed to use with a mesh-supported pellicle, embodiments of the present invention may be utilized with pellicles that are not mesh-supported. In both cases (mesh-supported and non-mesh-supported), embodiments of the present invention help to reduce any deleterious effects of shadowing of the reticle 30 caused by, for example debris that has come to rest on the pellicle or wrinkles/non-uniformities of the pellicle 34 itself.

In some embodiments of the present invention, the transducers 32a, 32b, or 45 may be used to induce high frequency motion in the pellicle to shake off debris that has come to rest on the pellicle and/or to prevent debris particles from coming to rest on the pellicle. In this way, more involved examination and cleaning of the pellicle may be undertaken less frequently, helping to extend the continuous operating time of the lithography apparatus. It will be appreciated that suitable frequencies and magnitudes of movement of the pellicle will depend upon a plurality of factors, such as a structure of the pellicle, to ensure that movement of the pellicle does not, itself, result in deleterious effects, such as damage to the pellicle.

As described above, a pellicle is mounted atop the surface of a reticle using a frame that supports the pellicle. For example, in the embodiment of FIG. 3 the pellicle 34 is supported by an inner frame 33 and an outer frame 31. A pellicle together with the frame(s) may be referred to as a pellicle assembly. In general, the entire pellicle assembly is mounted on the patterned surface of the reticle and remains on the patterned surface of the reticle during exposure of the reticle to EUV radiation. In some embodiments, however, in order to avoid reticle deformations, it is desirable that the pellicle assembly exert only small force on the reticle on which it is mounted.

Figure 8:
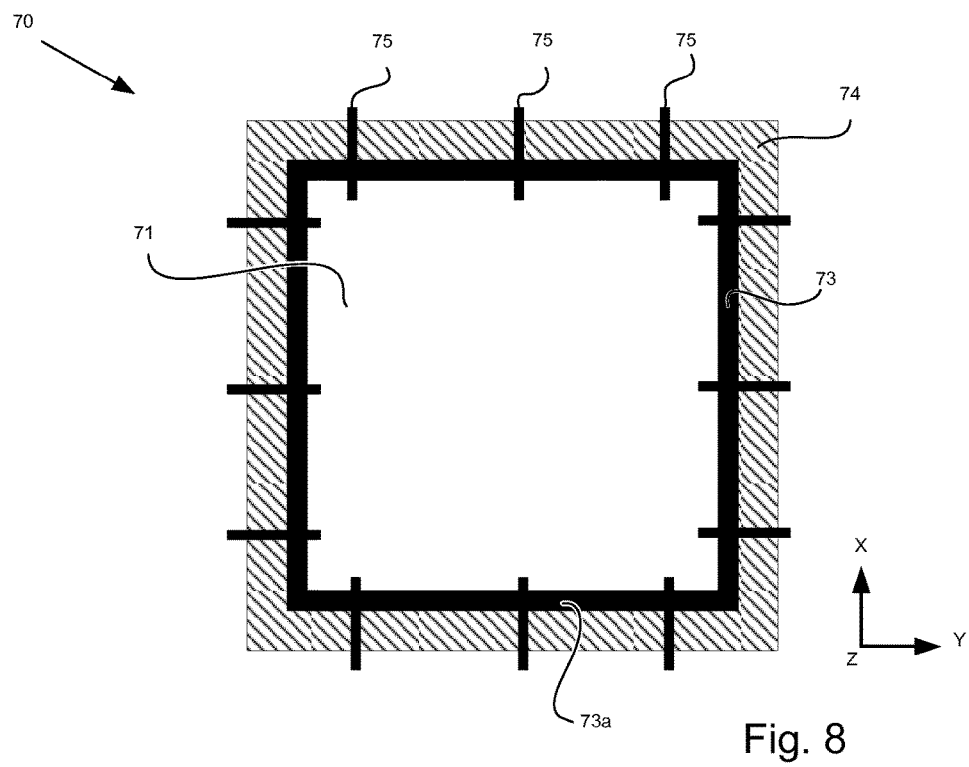
FIG. 8 is a schematic top view of a pellicle assembly according to an embodiment.

Referring to FIG. 8, there is described an embodiment comprising a pellicle assembly having a pellicle and a two-part frame. In FIG. 8 there is shown a top view of a pellicle assembly 70 comprising a pellicle 71, and a two-part frame. The two-part frame comprises an inner frame 73 and an outer frame 74. Both the inner frame 73 and the outer frame 74 are of generally rectangular shape in the when viewed from above, as in FIG. 8. The outer frame 74 is sized so as to fit around the inner frame 73 and is removably coupled to the inner frame 73. An inner edge of the outer frame 74 may abut an outer edge of the inner frame 73. Alternatively, a spacing may be present between the inner edge of the outer frame 74 and the outer edge of the inner frame 73.

The pellicle 71 is attached to the inner frame 73, thereby covering the cavity within the inner frame 73. Adhesive is applied to an underside (reticle facing side) of the inner frame 73 prior to placement of the pellicle assembly 70 onto a reticle. Once the inner frame 73 is fixed into place on a reticle surface, the outer frame 74 may then be removed from the pellicle assembly 70, thereby reducing the force on the reticle resulting from the pellicle assembly 70. The inner frame 73 may be adhered to the surface of a reticle in any appropriate way, such as for example glue, or by attachment to a further body (not shown).

By providing an outer frame 74, which is removable from the pellicle assembly 70, the pellicle assembly 70 can be more easily handled for positioning above, and mounting atop a reticle. For example, the outer frame 74 may be manipulated or may engage with positioning tools, without the need to engage the portion of the pellicle assembly 70 that will remain mounted atop the reticle during exposure of the reticle (i.e., the inner frame 73 and the pellicle 71).

The inner frame 73 may be constructed so as to be thin, lightweight and flexible, such that mounting the inner frame 73 to a reticle results in little, or no, deformation of the reticle. For example, in some embodiments, each edge of the inner frame 73 may have a cross sectional area in a plane perpendicular to the longitudinal axis of the edge (for example in a plane perpendicular to the Y axis for an edge 73a in FIG. 8) of 4 mm2 or less. For example, where the edge 73a of the inner frame 73 provides a generally rectangular cross section, the edge 73a may have a depth (i.e., in the direction of the X axis shown in FIG. 8) and a height (i.e., in the direction of the Z axis shown in FIG. 8) of 2 mm or less. The inner frame 73 may be constructed from any appropriate material or combination of materials. For example, in one embodiment, the inner frame 73 may be constructed of stainless steel.

By making the inner frame 73 thin and flexible, several further advantages are provided. For example, in addition to reducing or avoiding deformation of a reticle on which the inner frame 73 is mounted, the flexibility of the inner frame 73 is such that the inner frame 73 is relatively insensitive to changes variations in temperature, and to variations in the flatness of the surface of the reticle on which the inner frame 73 is to be mounted. Additionally, by making inner frame 73 thinner, less adhesive need to be used to attach the frame 73 to the surface of a reticle. Adhesives that are often used to attach a pellicle to a reticle surface (such as glue) may have high outgassing rates, which outgassing may absorb EUV radiation directed at a reticle. Reduction in the size of the inner frame 73 therefore reduces the amount of adhesive outgassing.

Further, it will be appreciated that as the numerical aperture of a lithographic apparatus increases, more space is required on the reticle. By reducing the size of the inner frame 73, the inner frame 73 takes up less space on the surface of a reticle, thereby providing additional space on the reticle and facilitating an increase of the numerical aperture.

By contrast with the inner frame 73, the outer frame 74 may be rigid. For example, the outer frame 74 may be sufficiently rigid to prevent deformation of the entire pellicle assembly 70 while the outer frame 74 is coupled to the inner frame 73. During mounting of the pellicle assembly 70 to a reticle, therefore, the outer frame 74 provides stiffness to the pellicle assembly 70, maintaining an underside of the pellicle assembly 70 (reticle facing side) substantially flat in a plane parallel to a plane defined by the surface of the reticle onto which the pellicle assembly 70 is to be mounted. Improved handling of the pellicle assembly 70 also allows the pellicle assembly 70 to be more easily transported, and more efficiently mounted onto a reticle.

The outer frame 74 may be connected to the inner frame 73 using any appropriate means. In some embodiments, the outer frame 74 may be attached to the inner frame 73 through a plurality of fasteners 75, such as pins. In the embodiment of FIG. 8, three fasteners 75 are provided along each edge of the pellicle assembly 70, providing twelve fasteners in total. In this way, the inner frame 73 is supported at three points along each of its edge. It will be appreciated, however, that any number of fasteners 75 may be used. For example, a greater number of fasteners 75 may be used with larger pellicles assemblies than are used with smaller pellicle assemblies.

In some embodiments, an automated tool may be used to mount the pellicle assembly 70 onto a reticle. An automated tool may be configured to connect to the outer frame 74 before positioning the pellicle assembly 70 above, and placing the pellicle assembly 70 onto a reticle. The automated tool may further be configured to remove the outer frame 74 from the pellicle assembly 70.

While the pellicle 71 shown in the embodiment of FIG. 8 does not comprise a supporting mesh, it will be appreciated that, in other embodiments, the pellicle 71 may comprise a mesh. Where the pellicle 71 comprises a mesh, the embodiment of FIG. 8 may be combined with one or more of the embodiments described with reference to FIGS. 3 to 7. For example, with reference to FIGS. 4 and 5, the upper frame 42, the inner frame 41 and the flexible member 43 may together comprise the inner frame 73 of FIG. 8.

For periodic meshes such as the mesh shown in FIGS. 6a, 6b, oscillation parameters such as speed, direction, amplitude may take a limited range of values given the desire to reduce overlap of shadows on a reticle caused by the grid structure of the mesh. Further, where a pellicle is oscillated in a single dimension, the pellicle is not constantly in movement. That is, when the displacement of the pellicle is at a maximum, the pellicle is stationary (i.e. the pellicle has a speed of zero). It will be appreciated that where the pellicle is stationary, the detrimental impact of the mesh on reticle is increased.

Figure 9:
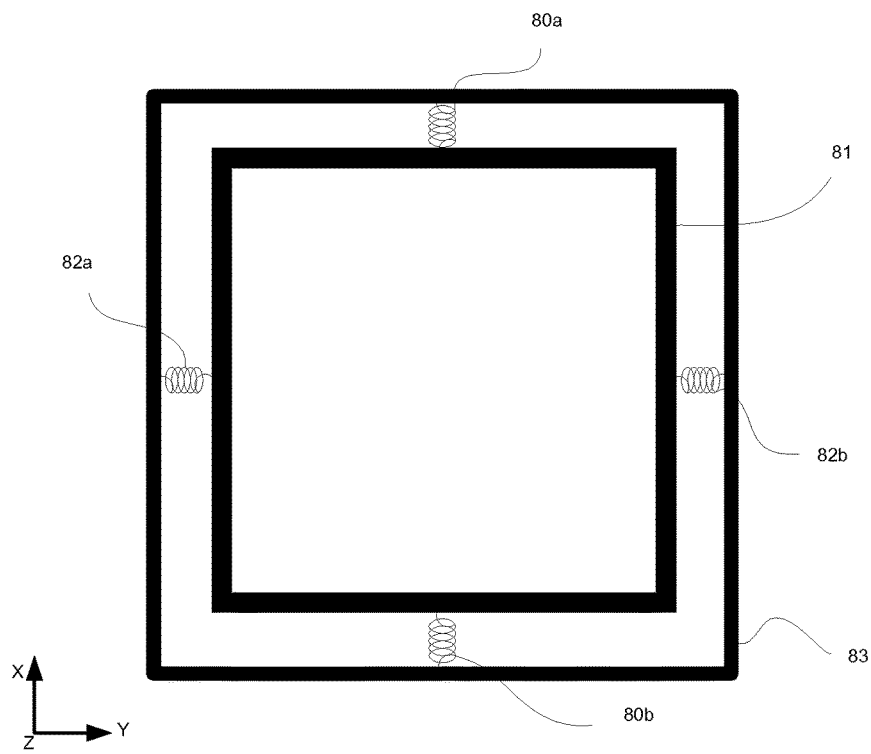
FIG. 9 is a schematic depiction of a pellicle arrangement according to a further alternative embodiment of the present invention.

To overcome the problem of stationary pellicles, the pellicle may be oscillated by a plurality of perpendicular inertial-coupled oscillatiors. Referring to FIG. 9, a first passive oscillator comprises two oscillating members 80a, 80b (depicted as helical springs in FIG. 9) connected to the pellicle/mesh 81 and an outer frame 83. The first oscillator is arranged to oscillate a pellicle/mesh 81 linearly in a direction parallel to an X axis. A second passive oscillator, comprising two oscillators members 82a, 82b (depicted as helical springs in FIG. 9) connected between the pellicle/mesh 81 and the outer frame 83, is arranged to oscillate the pellicle/mesh 81 linearly in a direction parallel to a Y axis perpendicular the X axis. It will be appreciated that the depicted helical springs are merely exemplary, and that any oscillators may be used. For example, while passive oscillators are shown, active oscillators such as those described above, may be provided.

Figure 10:
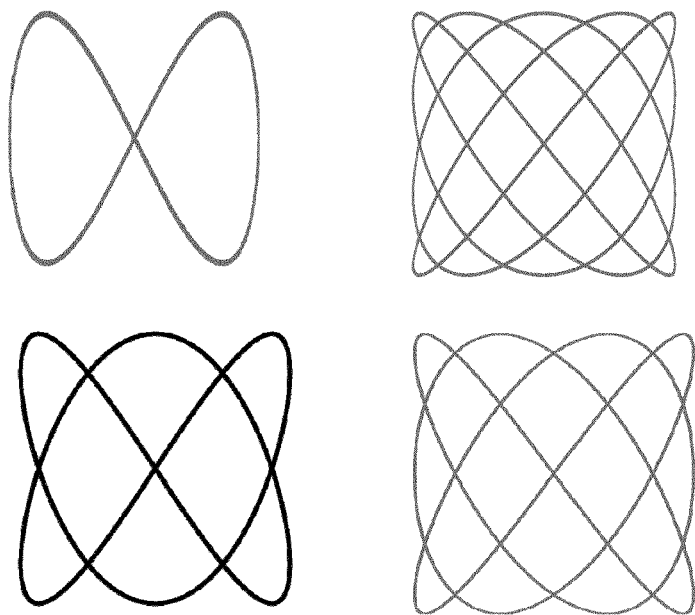
FIG. 10 is an image showing four exemplary Lissajous curves that can be described by two coupled harmonic oscillators.

Together, the first and second oscillators act to induce two-dimensional movement of the pellicle/mesh 81. Furthermore, by differing one or more of frequency, phase, and amplitude between oscillations of the first and second oscillators, the pellicle/mesh 81 may be caused to oscillate in a manner such that the pellicle/mesh 81 is not stationary during its movement. For example, the phase of each oscillator can be controlled such that when one of the first and second oscillators is at a maximum or minimum displacement, the other of the first and second oscillators is not at a maximum or minimum displacement. For example, the first and second oscillators may arranged to oscillate the pellicle/mesh 81 along a Lissajous curve. FIG. 10 illustrates four Lissajous curves which can be described by two coupled harmonic oscillators such as the first and second oscillators.

A pellicle/mesh oscillating in accordance with a pattern following a Lissajous curve is under constant movement with a displacement angle that varies over time. As such, with reference to FIG. 9, the pellicle/mesh 81 need not be stationary during its movement.

Where a mesh with a periodic grid structure is used, overlap of shadows on the surface of the reticle caused by the grid structure may be unavoidable due to the translational symmetry of the grid structure. In some embodiments, a mesh is provided with a quasi-periodic geometrical arrangement presenting no translational symmetry. For example, a "Penrose structure" may be used. An example Penrose structure is depicted in FIG. 10, in which a grid structure comprising lines (depicted in black) are arranged such that the gaps between the grid lines form Penrose tiles such as the Penrose tile shapes 86. It has been determined that providing a non-periodic grid structure, oscillation of the pellicle/mesh need not be in a specific direction or have a particular period as no overlap of features is possible. In this way, causing the pellicle/mesh to oscillate is greatly simplified. Further, it has been determined that pellicle meshes may be fabricated using the same process used to fabricate pellicle meshes with a periodic structure.

Figure 11:
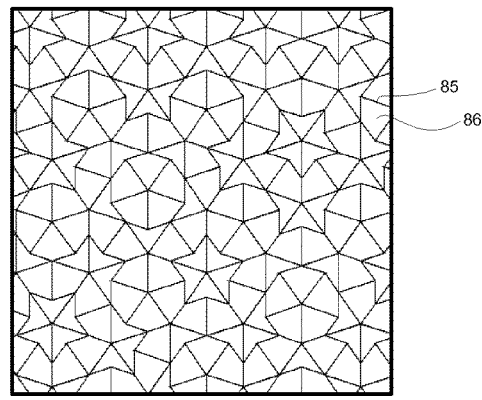
FIG. 11 is a schematic illustration of a pellicle support mesh having a Penrose tile structure.
Figure 12:
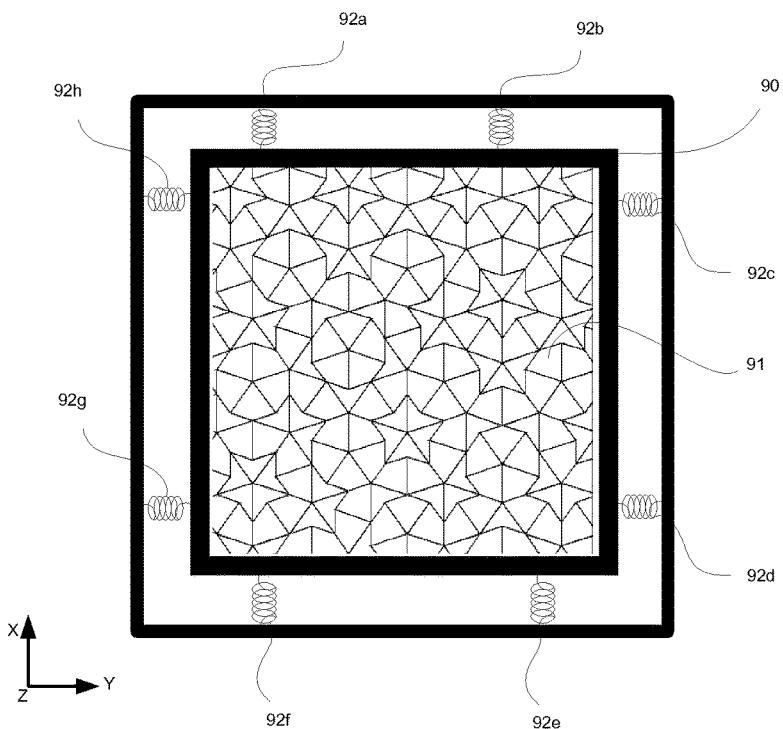
FIG. 12 is a schematic depiction of a pellicle arrangement according to a further alternative embodiment of the present invention.

FIG. 11 schematically illustrates an example embodiment of a pellicle assembly in which both a supporting mesh having a non-periodic grid structure, and perpendicular phase shifted inertial coupled oscillators are used in combination. In particular, a pellicle 90 is supported by a Penrose-grid supported mesh 91. Eight oscillating members 92a-92h connect the pellicle/mesh 90, 91 to an outer frame 93. Each of the oscillating members 92a-92h is a helical spring having a respective, and different, spring constant, thereby providing an asymmetrical oscillating system and providing a different phase, amplitude and frequency of oscillation in each of the X and Y directions. Use of a Penrose-grid mesh has been found to provide significantly better imaging performance compared to use of a hexagonal grid mesh, while reducing the amplitude, frequency and angle requirements of oscillation, and therefore reducing cost and complexity.

Again, it will be appreciated that the arrangement of oscillators illustrated in FIG. 10 is merely exemplary. For example, active oscillators (such as the actuators 32a, 32b depicted in FIG. 3) may be used in place of the depicted passive oscillators, or different passive oscillating means may be provided. As described above, where passive oscillating means are used, movement of the reticle stage may provide sufficient energy to induce oscillation of the passive oscillators and therefore the mesh/pellicle.

Figure 13:
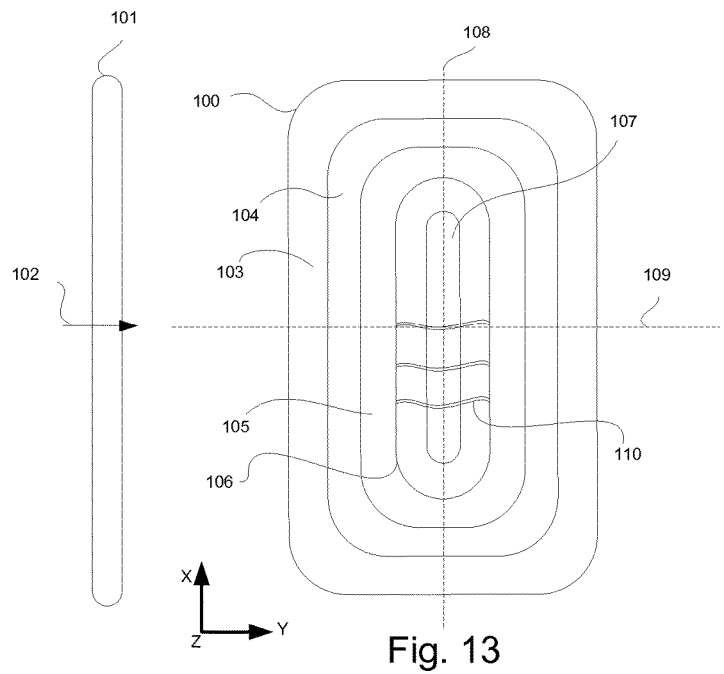
FIG. 13 is a schematic depiction of wrinkles formed by deflection of a pellicle experiencing thermal expansion.

During use, the radiation that is incident on a pellicle heats the pellicle causing it to thermally expand. The radiation that falls upon the pellicle is generally elongate in profile (slit-shaped). As such, the thermal expansion of the pellicle is greater along the longitudinal axis of the pellicle than it is along the latitudinal axis. This is schematically illustrated in FIG. 13 showing deflection (along the depicted z axis) within a generally rectangular pellicle 100 caused by a beam of radiation 101 scanned across the pellicle 100 in a scanning direction indicated by an arrow 102.

A first portion 103 of the pellicle 100 extending generally along an outer perimeter of the pellicle 100 is deflected by a least amount. Progressively more central portions 104, 105, 106, 107 of the pellicle 100 are deflected by respectively increasing amounts with the portion 107 being deflected by a greatest amount.

At any time during the scanning operation, while the radiation beam 101 is incident on the pellicle 100, the elongate nature of the profile of the radiation beam 101 causes thermal expansion within the pellicle 100 in strips that run generally parallel to a longitudinal axis 108 of the pellicle 100 (which extends in the depicted x-dimension). As such, thermal expansion of the pellicle is generally greatest along the longitudinal axis 108 of the pellicle 100 and least along a latitudinal axis 109 (which extends in the depicted y-dimension). The difference in thermal expansion between the x-dimension and the y-dimension can result in the development of wrinkles 110 on the surface of the pellicle 100, the wrinkles 110 extending generally parallel to the latitudinal axis 109 and the scan direction 102.

While the effect of any wrinkles which extend perpendicular to the scanning direction may be averaged-out over the surface of the substrate (i.e. wafer) by the scanning of the beam 101 across the pellicle, wrinkles which extend parallel to the scanning direction 102 are not averaged out by the scanning process and can therefore lead to non-uniform transmission of radiation through the pellicle to the surface of the substrate. Such non-uniformity can have a detrimental effect on the uniformity of the critical dimension at the substrate.

Figure 14:
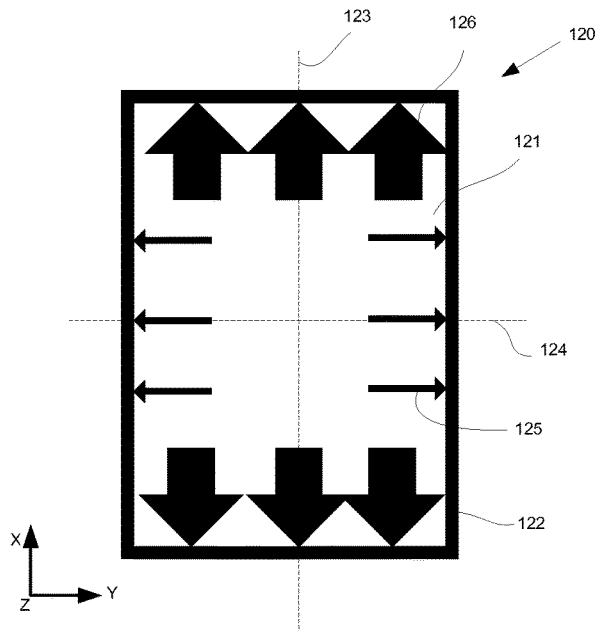
FIG. 14 is a schematic depiction of tensile stress that may be applied to a pellicle to avoid wrinkles.

Referring to FIG. 14, there is described a method to reduce the generation of detrimental wrinkles on the surface of a pellicle. A pellicle assembly 120 comprises a pellicle 121 mounted to a frame 122. The pellicle 121 has a longitudinal axis 123 extending in a depicted x-dimension and a latitudinal axis 124 extending in a depicted y-dimension.

The pellicle 121 is mounted in the frame 122 under a tensile stress. In particular, the pellicle 121 is under a first tensile stress (depicted by narrow arrows 125) in the y-dimension and under a second, larger, tensile stress (depicted by thick arrows 126) in the x-dimension. It has been determined that by having a larger tensile stress 126 in the dimension which experiences greater thermal expansion, the overall tensile stress within the pellicle 121 can be reduced. This is particularly beneficial as a pellicle is generally of thin construction to allow for the effective transmission of radiation (particularly EUV radiation), and each pellicle therefore has a relatively low tensile strength.

Pellicles experience tensile stress during use within a lithography apparatus. A pellicle which is under tensile stress before use (i.e. before being subject to stresses within a lithographic apparatus) may therefore be referred to as "pre-stressed".

The difference between the tensile pre-stress in the x-dimension and the tensile pre-stress in the y-dimension may be based upon a difference in the aspect ratio (x:y) of the radiation beam 101. Alternatively or additionally, expected thermal expansion of the pellicle 121 in both the x- and y-dimensions may be calculated for a particular use (based on the intensity of the radiation 101, the ambient operating temperature, etc). The difference between the tensile pre-stress applied in each dimension may therefore be based upon, and selected to reduce or to minimize, the expected thermal expansion. For example, the difference in tensile pre-stress applied to the pellicle in different dimensions may be proportional to the expected difference in thermal expansion in the those dimensions.

A pellicle assembly comprising a pellicle that is pre-stressed as described above may be provided in any convenient way. For example, a pellicle membrane may be pre-stressed and mounted in the pre-stressed condition to a pellicle frame. Alternatively, the pellicle may be mounted to a pellicle frame in a non-stressed condition, wherein the pellicle frame itself is configured to induce a tensile stress to the pellicle as described above. The pellicle assembly may be manufactured using a sputter deposition process that is configured to deposit a pellicle on a pellicle frame with the deposition process resulting in an inherent tensile stress as described above.

While the above description is generally concerned with pellicles, it will be appreciated that other membranes are used within a radiation system. For example, membranes are used for dynamic gas locks and may be used as spectral purity filters. The embodiments described above may therefore also be used in connection with other such membranes. The use of the membrane may determine the difference in stress applied to the x-dimensions and the y-dimensions of the membrane. For example, a pellicle may experience radiation having an aspect ratio of approximately 1:13, while a dynamic gas lock membrane may experience radiation having an aspect ratio of approximately 1:3.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims and clauses set out below.

Clauses

1. A method for manufacturing a membrane assembly for use as a pellicle assembly or as a dynamic gas lock membrane, comprising:

causing within a membrane a tensile stress of a first amount in a first dimension and a tensile stress of a second amount larger than the first amount in a second dimension;

wherein the membrane remains under different tensile stresses in the first and second dimensions while mounted to a frame.

2. The method of clause 1, wherein the second dimension is substantially parallel to a longitudinal axis of the membrane and the first dimension is substantially parallel to a latitudinal axis of the membrane.

3. The method of clause 1 or 2, wherein the second dimension is substantially perpendicular to a scanning direction of a radiation beam incident on the membrane during use and the first dimension is substantially perpendicular to the first dimension.

4. The method of any of clauses 1 to 3, wherein a difference between the first and second amounts of stress applied to the membrane is selected in dependence upon an aspect ratio of a scanning radiation beam incident on the membrane during use.

5. The method of any of clauses 1 to 4, wherein a difference between the first and second amounts of stress applied to membrane is selected in dependence upon a difference in thermal expansion induced in the membrane in the first dimension and the second dimension during use.

6. The method of any of clauses 1 to 5, wherein the membrane is for use as a pellicle and wherein a ratio between the first amount of stress and the second amount of stress is substantially 1:13.

7. The method of any of clauses 1 to 5, wherein the membrane is for use as a dynamic air lock membrane and wherein a ratio between the first amount of stress and the second amount of stress is substantially 1:3.

8. An apparatus for use as a pellicle assembly or a dynamic gas lock membrane assembly, comprising:
   a membrane mounted to a frame;
   wherein the mounted membrane is under tensile stress of a first amount in a first dimension and under tensile stress of a second amount greater than the first amount in a second dimension.

9. The apparatus of clause 8, wherein the second dimension is substantially parallel to a longitudinal axis of the membrane and the first dimension is substantially parallel to a latitudinal axis of the membrane.

10. The apparatus of clause 8 or 9, wherein the second dimension is substantially perpendicular to a scanning direction of a radiation beam incident on the membrane during use and the first dimension is substantially perpendicular to the first dimension.

11. The apparatus of any of clauses 8 to 10, wherein a difference between the first and second amounts of stress is substantially proportional to an aspect ratio of a scanning radiation beam incident on the membrane during use.

12. The apparatus of any of clauses 8 to 10, wherein a difference between the first and second amounts of stress is substantially proportional to a difference in thermal expansion induced in the membrane in the first dimension and the second dimension during use.

13. The apparatus of any of clauses 10 to 12, wherein the membrane is a pellicle and wherein a ratio between the first amount of stress and the second amount of stress is substantially 1:13.

14. The apparatus of any of clauses 8 to 12, wherein the membrane is a dynamic air lock membrane and wherein a ratio between the first amount of stress and the second amount of stress is substantially 1:3.

The invention claimed is:

1. An apparatus for shielding a reticle for lithography, the apparatus comprising:
   a pellicle; and
   at least one actuator configured to induce a movement of the pellicle with respect to the reticle, during an exposure of the reticle, to average an intensity variation of radiation received at the reticle over an exposure time and over a patterned surface of the reticle to obtain a substantially uniform intensity distribution of the radiation received at the reticle.

2. The apparatus according to claim 1, wherein the at least one actuator is configured to induce a periodic movement of the pellicle with respect to the reticle.

3. The apparatus according to claim 2, wherein the at least one actuator is configured to induce the periodic movement of the pellicle such that at least one period is completed in a time period for a local exposure to the radiation.

4. The apparatus according to claim 2, wherein the at least one actuator is configured to induce the periodic movement of the pellicle such that at least one period is completed in a time period for a full-field exposure to the radiation, wherein the radiation is incident on an entire area of the patterned surface of the reticle in the full-field exposure.

5. The apparatus according to claim 1, further comprising:
   a frame for supporting the pellicle above the reticle, wherein the frame comprises the at least one actuator.

6. The apparatus according to claim 5, wherein:
   the frame comprises a first frame member for mounting on a surface of the reticle and a second frame member for supporting the pellicle, and
   the first and second frame members are connected to each other by at least one of a flexible member, a resilient member, or a shock absorbing member.

7. A method for shielding a reticle of a lithography apparatus, the method comprising:
   inducing a movement of a pellicle relative to the reticle during an exposure of the reticle, wherein the pellicle is supported above the reticle during the exposure of the reticle to radiation; and
   averaging an intensity variation of the radiation received at the reticle over an exposure time and over a patterned surface of the reticle to obtain a substantially uniform intensity distribution of the radiation received at the reticle.

8. The method according to claim 7, wherein the movement is a passive movement.

9. The method according to claim 7, wherein the movement is a periodic movement.

10. The method according to claim 9, wherein at least one period of the periodic movement is completed in a time period for a local exposure.

11. The method according to claim 9, wherein at least one period of the periodic movement is completed in a time period for a full-field exposure, wherein the radiation is incident on an entire area of the patterned surface of the reticle in the full-field exposure.

12. The method according to claim 7, wherein the averaging comprises:
   substantially reducing an effect of shadowing caused by a mesh supporting the pellicle on the intensity distribution of the radiation received at the patterned surface of the reticle.

13. A reticle assembly for lithography, the reticle assembly comprising:
   a reticle having a patterned surface configured to impart a pattern to a radiation beam incident thereon;
   a pellicle held at least over the patterned surface; and
   at least one actuator configured to induce a movement of the pellicle with respect to the patterned surface, during an exposure of the patterned surface, to average an intensity variation of the radiation received at the patterned surface over an exposure time and over the patterned surface of the reticle to obtain a substantially uniform intensity distribution of the radiation received at the patterned surface of the reticle.

14. A lithographic apparatus configured to project a pattern from a reticle assembly onto a substrate with a radiation beam having a wavelength from about 5 nm to about 20 nm, wherein the reticle assembly comprises:
   a reticle having a patterned surface configured to impart the pattern to the radiation beam incident thereon;
   a pellicle held at least over the patterned surface;
   at least one actuator configured to induce a movement of the pellicle with respect to the patterned surface, during an exposure of the patterned surface, to average an intensity variation of the radiation received at the patterned surface over an exposure time and over the patterned surface of the reticle to obtain a substantially uniform intensity distribution of the radiation received at the patterned surface of the reticle.

15. An apparatus configured to inspect properties of a reticle having a patterned surface configured to impart a pattern to a radiation beam incident thereon, wherein the apparatus comprises a reticle assembly comprising:
   the reticle having the patterned surface configured to impart the pattern to the radiation beam incident thereon;
   a pellicle held at least over the patterned surface;
   at least one actuator configured to induce a movement of the pellicle with respect to the patterned surface, during an exposure of the patterned surface, to average an intensity variation of the radiation received at the patterned surface over an exposure time and over the patterned surface of the reticle to obtain a substantially uniform intensity distribution of the radiation received at the patterned surface of the reticle.

16. A pellicle assembly, comprising:

a pellicle; and a pellicle frame configured to support a pellicle above the reticle, wherein the pellicle frame comprises at least one actuator, wherein the pellicle frame comprises an inner frame for supporting the pellicle above the reticle and an outer frame removably coupled to the inner frame, and wherein the at least one actuator is configured to induce a movement of the pellicle with respect to the reticle, during an exposure of the reticle, to average an intensity variation of radiation received at the reticle over an exposure time and over a patterned surface of the reticle to obtain substantially uniform intensity distribution of the radiation received at the reticle.

17. The pellicle assembly of claim 16, wherein at least three fasteners are provided along each edge of the pellicle frame.

18. The pellicle assembly of claim 16, wherein the outer frame is arranged for coupling to an automatic placement tool.

19. A pellicle assembly, comprising:

a pellicle; and a pellicle frame configured to support the pellicle above a reticle and configured to, in use, induce a movement to the pellicle with respect to the reticle, wherein:

the pellicle frame comprises a first frame member configured to mount on a surface of the reticle and a second frame member configured to support the pellicle, and the first and second frame members are connected to each other by at least one of a flexible member, a resilient member, or a shock absorbing member.

20. The pellicle assembly according to claim 19, wherein the movement induced is a periodic movement of the pellicle with respect to the reticle.

21. The pellicle assembly according to claim 20, wherein the pellicle frame is configured to induce the periodic movement such that at least one period is completed in a time period for a local exposure of the reticle to radiation.

22. The pellicle assembly according to claim 20, wherein the pellicle frame is configured to induce the periodic movement such that at least one period is completed in a time period for a full-field exposure of the reticle to radiation, wherein the radiation is incident on an entire area of a patterned surface of the reticle in the full-field exposure.

23. The pellicle assembly according to claim 19, wherein the pellicle frame comprises at least one actuator configured to induce the movement of the pellicle.

24. An apparatus for shielding a reticle for lithography, the apparatus comprising:

a pellicle;

at least one actuator configured to induce a movement of the pellicle with respect to the reticle, during an exposure of the reticle, to reduce an intensity variation of radiation received at the reticle over an exposure time to obtain a substantially uniform intensity distribution of the radiation received at the reticle; and two actuators, each actuator being arranged to induce oscillations in the pellicle in a direction perpendicular to the other actuator.

* * * * *